US008089026B2

(12) United States Patent
Sellers

(10) Patent No.: US 8,089,026 B2
(45) Date of Patent: Jan. 3, 2012

(54) METHODS FOR CONTROL OF PLASMA TRANSITIONS IN SPUTTER PROCESSING SYSTEMS USING A RESONANT CIRCUIT

(75) Inventor: Jeff C Sellers, Manchaca, TX (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 11/216,424

(22) Filed: Aug. 30, 2005

(65) Prior Publication Data
US 2006/0011591 A1 Jan. 19, 2006

Related U.S. Application Data

(63) Continuation of application No. 10/642,509, filed on Aug. 18, 2003, now Pat. No. 6,967,305.

(51) Int. Cl.
B23K 10/00 (2006.01)

(52) U.S. Cl. .......... 219/121.57; 204/192.13; 204/192.33

(58) Field of Classification Search ............. 156/345.28, 156/345.24; 204/192.12, 192.13, 192.33; 219/121.43, 121.54, 121.57, 121.59; 361/7
See application file for complete search history.

(56) References Cited

U.S. PATENT DOCUMENTS

| | | |
|---|---|---|
| 4,122,816 A | 10/1978 | Fitzgerald et al. |
| 4,284,490 A | 8/1981 | Weber |
| 4,557,819 A | 12/1985 | Meacham et al. |
| 4,902,394 A | 2/1990 | Kenmotsu et al. ........ 204/192.12 |
| 4,996,646 A | 2/1991 | Farrington .................... 364/483 |
| 5,166,887 A | 11/1992 | Farrington et al. .......... 364/483 |
| 5,170,360 A | 12/1992 | Porter et al. .................. 364/483 |
| 5,192,894 A * | 3/1993 | Teschner .................. 204/192.23 |
| 5,241,152 A * | 8/1993 | Anderson et al. ........ 219/121.57 |
| 5,505,835 A | 4/1996 | Sakaue et al. ............ 204/192.26 |
| 5,554,809 A | 9/1996 | Tobita et al. .................... 73/700 |
| 5,584,974 A * | 12/1996 | Sellers ..................... 204/192.13 |
| 5,616,224 A | 4/1997 | Boling .................... 204/298.08 |
| 5,630,952 A | 5/1997 | Karino et al. |
| 5,645,698 A | 7/1997 | Okano ..................... 204/192.12 |
| 5,651,865 A | 7/1997 | Sellers ..................... 204/192.13 |
| 5,664,066 A | 9/1997 | Sun et al. ........................ 395/23 |
| 5,682,067 A | 10/1997 | Manley et al. |
| 5,711,843 A | 1/1998 | Jahns ............................ 156/345 |
| 5,718,813 A | 2/1998 | Drummond et al. ..... 204/192.12 |

(Continued)

FOREIGN PATENT DOCUMENTS

JP 06119997 4/1994

(Continued)

OTHER PUBLICATIONS

Cobine, *Gaseous Conductors, Theory and Engineering Applications*,(1958) Chapter 8, "Glow Discharges," pp. 205-289.

(Continued)

*Primary Examiner* — Geoffrey S Evans

(74) *Attorney, Agent, or Firm* — Proskauer Rose LLP.

(57) ABSTRACT

Methods and apparatus for controlling a plasma used for materials processing feature cooperative action of a resonant circuit and a switch unit coupled to a plasma vessel and a power supply. A sensor for acquiring a signal associated with a state of a plasma in the plasma vessel supports closed-loop control of the switch unit. Undesirable plasma states detected by the sensor can be eliminated by closing the switch unit to shunt the resonant circuit.

5 Claims, 10 Drawing Sheets

U.S. PATENT DOCUMENTS

| | | | |
|---|---|---|---|
| 5,729,119 A | 3/1998 | Barbour | 323/222 |
| 5,759,424 A | 6/1998 | Imatake et al. | 216/60 |
| 5,770,023 A | 6/1998 | Sellers | 204/192.3 |
| 5,796,214 A | 8/1998 | Nerone | 315/209 R |
| 5,807,470 A | 9/1998 | Szczyrbowski et al. | |
| 5,810,982 A | 9/1998 | Sellers | 204/298.08 |
| 5,831,851 A | 11/1998 | Eastburn et al. | 364/167.01 |
| 5,917,286 A * | 6/1999 | Scholl et al. | 315/111.21 |
| 5,971,591 A | 10/1999 | Vona et al. | |
| 6,001,224 A | 12/1999 | Drummond et al. | 204/192.12 |
| 6,007,879 A * | 12/1999 | Scholl | 427/562 |
| 6,020,794 A | 2/2000 | Wilbur | 333/17.1 |
| 6,291,999 B1 | 9/2001 | Nishimori et al. | 324/464 |
| 6,416,638 B1 * | 7/2002 | Kuriyama et al. | 204/298.08 |
| 6,483,678 B1 * | 11/2002 | Morita et al. | 204/192.12 |
| 6,521,099 B1 | 2/2003 | Drummond et al. | 204/192.12 |
| 6,524,455 B1 * | 2/2003 | Sellers | 204/298.08 |
| 6,740,207 B2 * | 5/2004 | Kloeppel et al. | 204/192.1 |
| 6,794,601 B2 | 9/2004 | Norris et al. | 219/121.57 |
| 6,808,607 B2 * | 10/2004 | Christie | 204/298.08 |
| 6,858,446 B2 * | 2/2005 | Denda et al. | 156/345.24 |
| 6,943,317 B1 | 9/2005 | Ilic et al. | 219/121.57 |
| 7,224,287 B2 * | 5/2007 | Heider et al. | 340/644 |
| 2002/0131555 A1 | 9/2002 | Fleming et al. | |
| 2003/0132195 A1 * | 7/2003 | Edamura et al. | 216/59 |
| 2003/0146083 A1 | 8/2003 | Sellers | |
| 2003/0205460 A1 * | 11/2003 | Buda | 204/192.13 |
| 2003/0226827 A1 | 12/2003 | Chu et al. | |
| 2004/0118516 A1 * | 6/2004 | Grasshoff et al. | 156/345.24 |
| 2004/0124077 A1 | 7/2004 | Christie | 204/192.12 |
| 2005/0236266 A1 * | 10/2005 | Poole et al. | 204/192.13 |
| 2005/0252884 A1 * | 11/2005 | Lam et al. | 216/59 |

FOREIGN PATENT DOCUMENTS

| | | |
|---|---|---|
| JP | 7-188919 | 7/1995 |
| WO | WO 9947727 A1 * | 9/1999 |
| WO | EP 1195793 | 4/2002 |
| WO | WO03049128 A1 * | 6/2003 |

OTHER PUBLICATIONS

Chapman, *Glow Discharge Processes, Sputtering and Plasma Etching*, (1980) Chapter 2 "Gas Phase Collison Processes," pp. 21-49.

Boxman et al, *Handbook of Vacuum Arc Science and Technology, Fundamentals and Applications*, (1995) "Foreword", pp. vii-viii, "Preface" pp. ix-xv, and Chapter 2, "Arc Ignition," pp. 28-72.

\* cited by examiner ns SPUTTER PROCESSING
METHODS FOR CONTROL OF PLASMA TRANSITIONS IN SPUTTER PROCESSING SYSTEMS USING A RESONANT CIRCUIT

RELATED APPLICATIONS

This application is a continuation of application Ser. No. 10/642,509, filed on Aug. 18, 2003, now U.S. Pat. No. 6,967,305, for which the benefit of its filing date is claimed under 35 U.S.C. §120. The entire disclosure of U.S. Ser. No. 10/642,509 is incorporated herein by reference.

FIELD OF THE INVENTION

The present invention relates generally to plasma-based materials processing. More particularly, the invention relates to control of arcs and control of plasma state transitions in plasma processing systems.

BACKGROUND OF THE INVENTION

Many manufacturing operations utilize plasma processing. Plasma-enhanced Vapor Deposition (PVD), for example, is increasingly used for deposition of thin metallic and non-metallic films. Most PVD systems are either of the cathodic arc or sputtering types. While the arc discharge plasma utilized in a cathodic arc PVD systems is characterized by high currents and low voltages, the glow plasma utilized in sputter PVD systems is characterized by lower currents and higher voltages. Sputter PVD systems often include features that provide magnetic fields to support electric field ionization of the glow plasma.

A glow plasma and an arc discharge plasma, under appropriate conditions, can exhibit mode shifts. For example, a glow plasma can transition to an arc discharge plasma, white, though unlikely, an arc discharge plasma can transition to a glow plasma.

Undesired arcing is a significant problem for the performance of sputter PVD systems. Arcing can be caused by a variety of factors. For example, arcing might be caused by flaking of the target during sputtering, overheating of the target, a gas disturbance within the plasma, or impurities in either the inert gas utilized to form the plasma or the target material. Inherently, plasma noise produces a certain amount of "micro-arcing" within a glow plasma inside the deposition chamber. However, the micro-arcing may develop into more severe plasma arcing, or "hard arcing", within the chamber. An arc can remove the poisoning from the target, but it may also generate undesirable particles.

Some systems cope with arcing by shutting down the power supply when an arc is detected. For example, detection of a severe arc can cause the power supply to momentarily interrupt its output, for example, for 0.100-25 msec. Arcing current fluctuations, however, can have a frequency in the order of 1-10 MHz (i.e., a duration of 0.1-1.0 μsec).

Some power supplies may exacerbate the problems associated with plasma arcing. For example, a DC power supply can have energy stored in an output stage, such as in an output filter. Upon the appearance of micro-arcing or arcing conditions, the stored energy may be discharged into the sputtering chamber. The discharged energy pulse has a duration of approximately 0.2-20 μsec, which is too rapid to be controlled or limited by common detection circuitry of the power supply.

Some systems periodically interrupt or apply a voltage reversal of the cathode voltage in an attempt to avoid arcing. The deposition rate may be reduced, however, because the cathode voltage is not continuously applied. Moreover, periodic suppression circuitry adds significant cost. Periodic suppression systems are usually employed when defect free deposition is required, such as in the manufacture of semiconductors.

SUMMARY OF THE INVENTION

The invention, in part, arises from the realization that the cooperative action of a resonant circuit and a shunt switch can provide improved response to arc initiation, improved transition between different plasma states, and improved ignition of a plasma. According to principles of the invention, a resonant circuit, when shunted, can drive a plasma current to zero and thus extinguish the plasma in a brief period of time that effectively reduces, for example, arc related damage. Cooperative action of the resonant circuit and the shunt can also improve ignition of glow and arc discharge plasmas.

In one embodiment, a controller, in response to a signal that indicates a state or state transition of a plasma in a plasma vessel, supports closed-loop control of the plasma state in the plasma vessel. The signal can be provided, for example, by a flux sensor detecting a flux of an inductor in the resonant circuit. The invention features, in part, improved means to transition from an arc plasma to a glow plasma, or transition from a glow plasma to an arc plasma. The invention features plasma transitions that entail removal of an undesired plasma state before reignition of a desired plasma state.

Accordingly, in a first aspect, the invention features an apparatus for controlling a plasma used for materials processing. The apparatus includes a resonant circuit, sensors, and a switch unit. The resonant circuit is in electrical communication with an output of a power supply and an input of a plasma vessel. The sensor acquires a signal associated with a state of a plasma in the plasma vessel. The switch unit has a first state (for example, open) and a second state (for example, closed), and can be switched between states in response to the signal. The second state of the switch unit shunts the resonant circuit to permit a resonance of the resonant circuit that causes a change in the state of a plasma in the vessel. The resonant circuit can store and release energy.

The sensor can be configured to sense a flux induced by an inductor of the resonant circuit. The sensor can be a coil placed adjacent to the inductor. Such a sensor can provide quick detection of the onset of an arc plasma during glow plasma processing. The switch unit can have a resistance that is large enough to effectively act as a damping impedance for the resonant circuit during shunting.

The apparatus can include a controller for receiving the signal from the sensor, and for causing the switch unit to switch to at least one of the first state and the second state to affect the state of the plasma. The controller can be configured to cause the switch unit to switch to the second state when a transition of the state of the plasma is indicated by a change in the signal. The apparatus can also include a voltage clamp circuit in parallel with the input of the plasma vessel. The voltage clamp can be an asymmetric voltage clamp.

The apparatus can include a zero-bias supply unit in series with the switch unit. The supply unit can apply an offset voltage to the switch unit. The offset voltage is associated with a voltage drop caused by a resistance of the switch unit and/or parasitic circuit elements associated with the switch unit.

The apparatus can further include a voltage sensor for sensing a voltage of at least one of the resonant circuit, the power supply, and the input of the plasma vessel. The apparatus can further include a current sensor for sensing a current of at least one of the resonant circuit, the power supply, and the input of the plasma vessel. The additional sensors can provide improved detection of plasma state transitions.

In a second aspect, the invention features a method for controlling a plasma used for materials processing. The method includes providing a resonant circuit in electrical communication with an output of a power supply and an input of a plasma vessel, detecting a change that indicates a transition of a state of a plasma in the plasma vessel, and shunting the resonant circuit after the change is detected to permit a resonance of the resonant circuit. Shunting the resonant circuit can extinguish the plasma in the vessel prior to reignition of a desired plasma state.

In response to detection of a state change, for example, the transition from a glow plasma mode to an arc plasma mode, shunting can include substantially reducing a current flowing through the plasma vessel during an initial half cycle of the resonant circuit relative to a current flowing through the vessel prior to the initial half cycle. The shunt can be removed for the next half cycle before again shunting if the arc discharge plasma persists. The shunt and wait cycle can be repeated until the original plasma mode is restored, in response to feedback from one or more sensors.

The method can include reigniting the plasma in the plasma vessel. Reigniting can include shunting the resonant circuit to increase an energy stored in the resonant circuit, and removing the shunt to direct the stored energy to the input of the plasma vessel to ignite the plasma in the plasma vessel.

In a third aspect, the invention features a method for igniting a plasma used for materials processing. The method includes providing a resonant circuit, shunting the output of the power supply to increase an energy stored in the resonant circuit, and removing the shunt to direct the stored energy to the input of the plasma vessel to ignite the plasma in the plasma vessel.

The resonant circuit can be shunted until the resonant circuit causes a current of the power supply to be greater than a steady-state current of an arc plasma. The shunt can then be removed to commute the current to the input of the plasma vessel to ignite an arc plasma in the plasma vessel. The resonant circuit can be shunted for an effective portion of a cycle of the resonant circuit to increase an energy stored in the resonant circuit. The shunt can then be removed to direct the stored energy to the plasma vessel after the effective portion of the cycle to ignite a glow plasma in the plasma vessel.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1A:
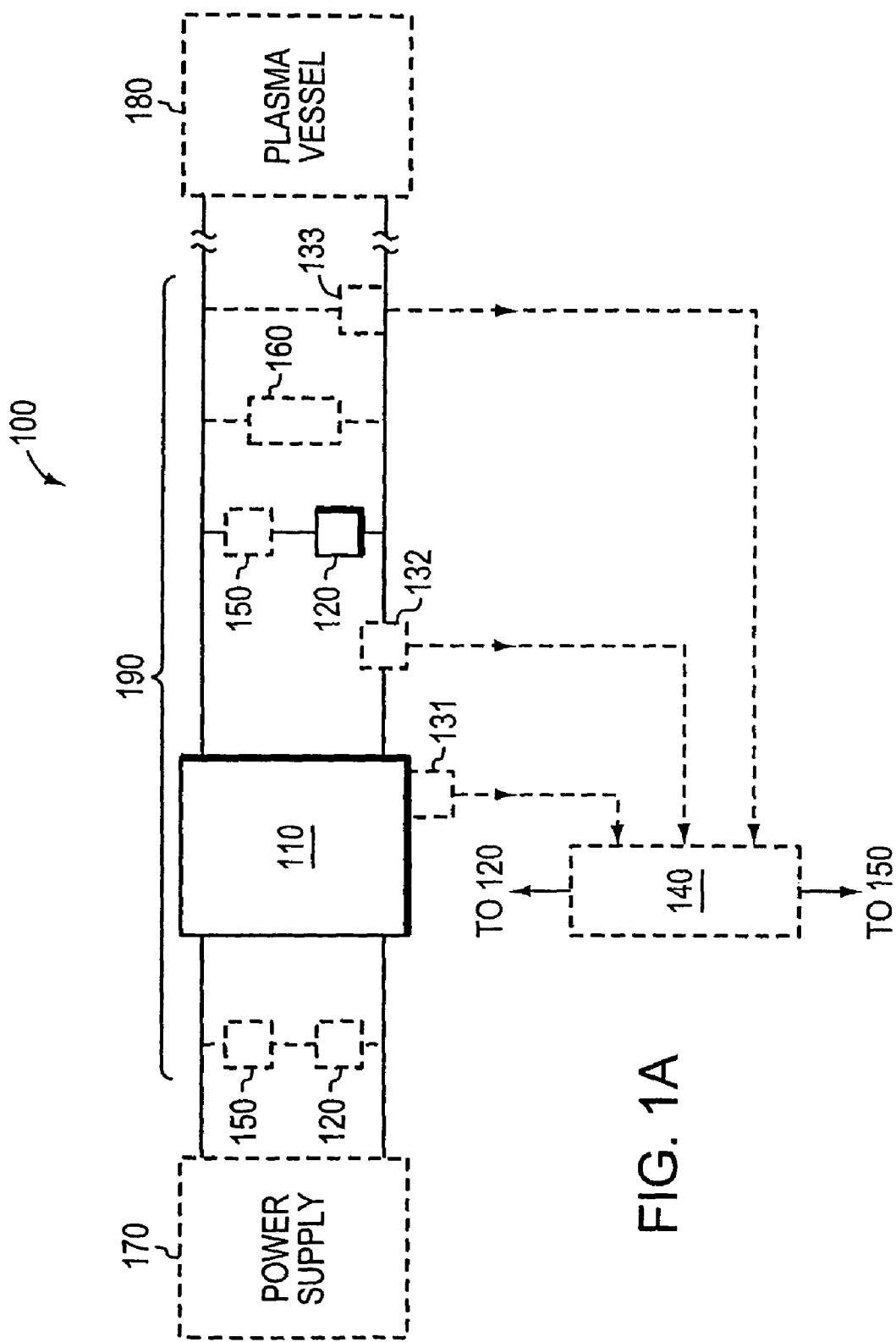
FIG. 1a is a block diagram of embodiments of the invention that include features for controlling a plasma in a plasma processing system.

A "plasma system" is an apparatus that includes plasma generation components, and can include materials processing components. A plasma system can include one or more vessels, power supply components, metrology components, control components, and other components. Processing can occur in the one or more vessels and/or in one or more processing chambers in communication with the one or more vessels. A plasma system can be a source of plasma or reactive gas species generated in a plasma or can be a complete processing tool.

A "vessel" is a container or portion of a container that contains a gas and/or a plasma, and within which a plasma can be ignited and or/maintained. A vessel is combined with other components, such as power generation and cooling components to form a plasma processing system.

A "plasma" is a state of matter that includes a collection of energetic charged particles that can be developed through application of a combination of electrical and magnetic fields to induce ionization in a related gas. In a general sense, a plasma is a collection of charged ions, electrons and neutral particles, which taken as a whole are neutral, due to the restorative fields generated by the movement of the charged particles. A plasma is electrically conductive due to the charged particles. A plasma in a vessel may be considered to be extinguished when the vessel can no longer carry a current, or when the plasma does not produce light. Other means of determining plasma extinction include those related to the electrical characteristics of the plasma. For example, without a plasma, a plasma vessel cathode can have a capacitive characteristic with a typical capacitance value in a range from 100 pf to 1 uf.

The plasma however has an inductive character (voltage leads current) due to the mass of the ions moving to the cathode. Hence, if the sensors measure a capacitive character of the plasma vessel, then the plasma has been extinguished. If the sensors measure an inductive character, then a plasma exists in the plasma vessel, and, depending on the voltage-current, ratio the operating mode of the plasma may be determined.

"Ignition" is the process of causing an initial breakdown in a gas, to form a plasma.

The phrases "glow discharge plasma," "glow plasma," and "glow" are herein used interchangeably to refer to a plasma state sustained by a relatively high voltage and low current in comparison to an arc discharge plasma. A glow plasma, as used herein and depending on context, can encompass glow and superglow plasmas.

The phrases "arc discharge plasma," "arc plasma," and "arc" are herein used interchangeably to refer to a plasma state sustained by a relatively low voltage and high current. An arc plasma, as used herein and depending on context, can encompass micro arcs and hard arcs.

The following description will focus on exemplary cathodic DC-based sputtering systems. It will be apparent, however, to one having ordinary skill in the plasma processing arts that principles of the invention may be applied to a variety of plasma processing systems, including systems that entail AC induced plasmas, such as RF plasma systems.

FIG. 1a is a block diagram of embodiments of the invention that include features for controlling a plasma in a plasma processing system 100. The apparatus of the invention 190 includes a resonant circuit 110, a switch unit 120 that has first and second states. The system 100 illustrated in FIG. 1a includes a power supply 170 having an output, a plasma vessel 180 having an input for receiving power from the power supply 170 and/or the resonant circuit 110, a voltage clamp unit 160 in parallel with the switch unit 120, a flux sensor 131, a current sensor 132, a voltage sensor 133, and a controller 140 for receiving signals from the sensors 131, 132, 133 and controlling the switch unit 120 and the zero-bias supply unit 150. The switch unit shunts the resonant circuit 110 when in the second state, for example, a closed state.

The power supply 170 can be, for example, a DC or an RF power supply, and the plasma vessel 170 can respectively be, for example, a capacitively coupled or inductively coupled plasma vessel, as well as a magnetically enhanced cathode (e.g., a magnetron) or a simple diode type cathode known in the plasma processing arts. The switch unit 120 is electrically connected in parallel with an output of the power supply 170 and an input of the plasma vessel 180. The resonant circuit 110 is electrically connected in parallel with the input of the plasma vessel 180 and the output of the power supply 170. Different embodiments will include the switch unit 120 in different locations within the plasma processing system 100. FIG. 1a illustrates two possible locations for the switch unit 120.

The plasma vessel 180 can be electrically connected to other components of the system 100, but remotely located with respect to them. For example, the components of the system 100 which can be connected via a long high voltage cable to the plasma vessel 180.

The switch unit 120 permits shunting of the resonant circuit 110. When closed in response, for example, to the detection of an undesired arc plasma in the vessel 180, the switch unit 120 can shunt the resonant circuit 110, in effect creating an alternative electrical path that competes for the current flow with the arc in the plasma vessel 180. The arc can cause the impedance of the load presented by the plasma vessel 180 to decrease while current is ringing up in the resonant circuit 110. Thus, the switch unit 120 may share a fraction of the current flow with the plasma vessel 180. The peak current and total energy of the arc, and, therefore, the damage caused by the arc, can be effectively reduced if the current has an alternative path. The shunt can reduce the time required to bring the arc to a zero current, i.e., to a no plasma state. The plasma may be considered to be extinguished in this condition.

The arc plasma impedance tends to decrease in association with the total current through the arc. This effect arises from the additional thermal ionization inherent in the arc discharge. Hence, reduction in the current available to the arc can effectively reduce the temperature rise of the discharge. The switch unit 120 provides an alternate current path. The switch unit 120 impedance can be chosen to be similar to the arc impedance of the system 100. It can be desirable, however, to select a switch unit 120 having an impedance that is not too low, as there can be a benefit to the switch unit 120 dissipating some of the energy.

The power supply 170 and the resonant circuit 110 can each include their own inductors, or can share one or more inductors or a portion of an inductor. In some embodiments, an inductor of the resonant circuit has a smaller inductance that the inductance of an inductor of the power supply 170.

The a flux sensor 131 may be configured to detect a magnetic flux generated by an inductor of the resonant circuit 110. The flux sensor 131 can provide a relatively simple and effective way to monitor the state of the plasma. For example, by simply adding a second winding to an inductor of the resonant circuit 110, the second winding may be used as a flux sensor 131 to provide an excellent plasma transition detector. With a location as the last series component in the connections to the plasma vessel 180, transient changes in current to the plasma vessel 180 generate a corresponding change in the coupled flux of the sensor 131 winding.

Thus, the flux sensor 131 can be used to detect a rapid change of the plasma current and/or voltage. When such a change is detected, the controller 140 may act to operate the switch unit 120 to cause the resonant circuit 110 to ring out. Once the current and voltage crossover (go from voltage leading current to current leading voltage) and reach zero, the sensor 131 can be used to monitor the restart of the correct plasma mode. Plasma modes can have distinctive characteristics, which can be used to decide if the plasma is restarting in the correct mode.

Figure 1B:
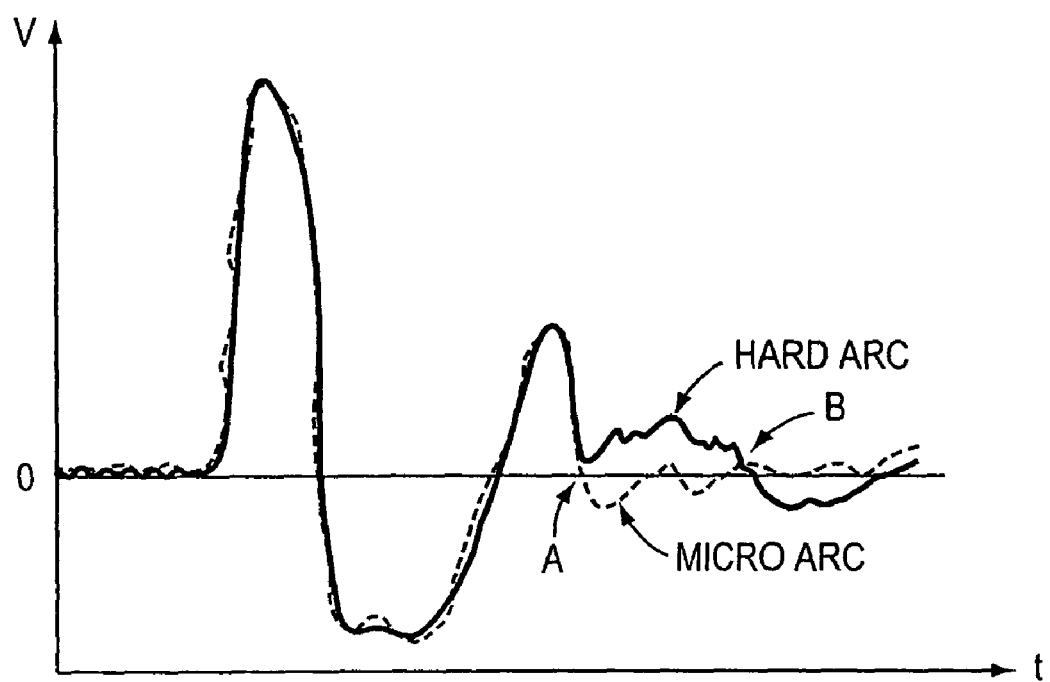
FIG. 1b is an exemplary graph of the voltage over time detected by a flux sensor in response to a micro arc and a hard arc.
Figure 1C:
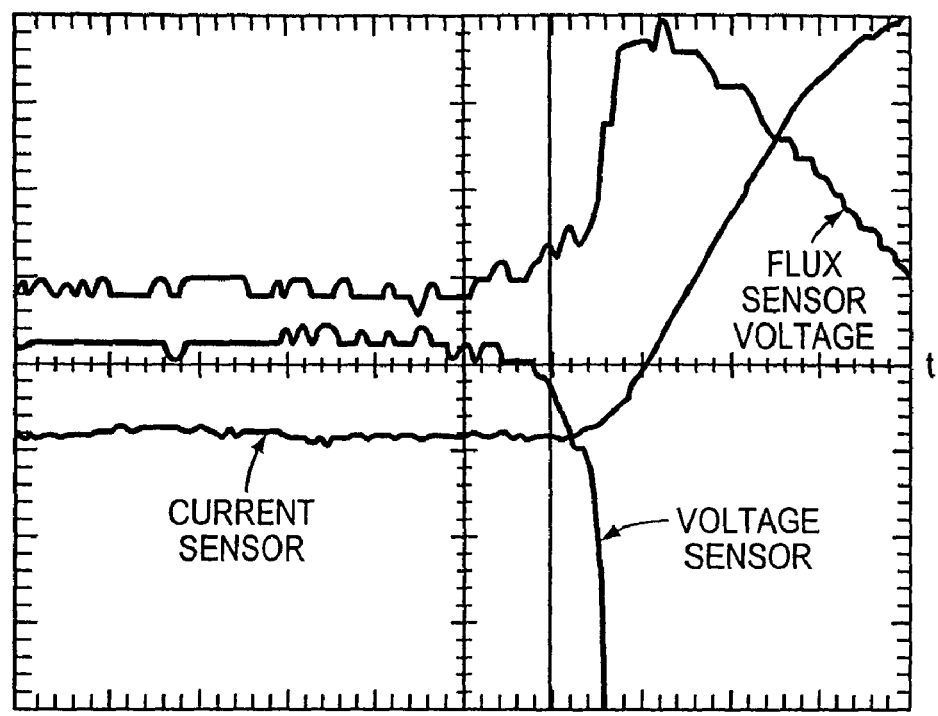
FIG. 1c is an exemplary graph of voltage over time detected by a flux sensor, current over time detected by a current sensor, and voltage over time detected by a voltage sensor for the occurrence of an arc.
Figure 1D:
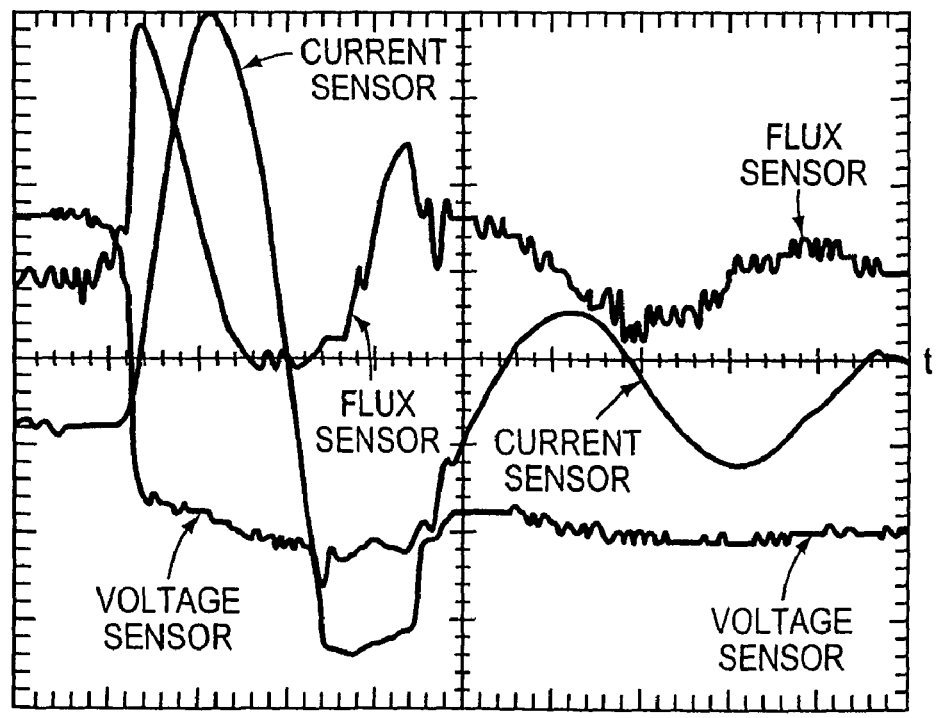
FIG. 1d is a graph that corresponds to the graph of FIG. 1c, though illustrating the behavior of the curves over a greater length of time.

Referring to FIGS. 1b, 1c and 1d, the flux sensor 131 can detect the voltage and/or current rise associated with reignition and the beginning of plasma run. The flux sensor 131 can also distinguish between the ignition of different types of plasma states. FIG. 1b is an exemplary graph of the voltage over time detected by a flux sensor 131 in response to a micro arc and a hard arc. The "back porch" of the signal from the flux sensor 131 shows the voltage for the micro arc dropping to zero before the voltage for the hard arc, which has tended to persist. Arrow A indicates the time at which the micro arc induced voltage has dropped to zero, which arrow B indicates the time at which the hard arc induced voltage has dropped to zero.

Alternatively, in addition to the flux sensor 131, the controller 140 may also use voltage and/or current measurements, for example, from the current sensor 132 and the voltage sensor 133, to define the plasma state. Depending on the location of the measurement points, different information will be gained to aid the controller's decision process. An example would be measuring the voltage-current ratio to define the mode of the present plasma operation. Another example would be confirming the continuity of the reignition by measuring the voltage after one resonant period and again after two periods. Further, the combined use of two or more measured values can allow the controller's functionality to change to better meet the plasma mode and needed control strategy.

For example, by appropriately combining measured values from the three sensors 131, 132, 133 with the control rules it is possible to anticipate the imminent occurrence of an arc transition in a glow plasma. When these conditions are detected, the controller 140 can set an anticipate flag and cycle the switch unit 120 to stop the plasma (for example, shutting it off, and restarting it.) This can allow the conditions leading to the "expected arc" to be stopped prior to the arc actually occurring, thereby reducing the possibility of particle generation.

The duration of one or more signals used for the anticipate function may be available only for a short period, for example, less than 3 μs prior to the transition. They may also be available for detection in fewer than all transitions, for example, in 20% to 60% of transitions. For the glow to arc transition, there is often a small linear voltage drop, without a corresponding current change just before and leading into the arc transition. A variation of this is when the voltage shift occurs for a short time then returns to normal just before (2 μsec to 10 μsec ) the arc transition.

FIG. 1c is an exemplary graph of the flux sensor 131 voltage over time, current sensor 132 current over time, and voltage sensor 133 voltage over time detected over a period of time shortly before and after the occurrence of an arc. The curves illustrate the above-described anticipatory behavior. FIG. 1d is a graph that includes the sample curves as does FIG. 1c with, however, a greater length of time included to show the extended behavior of the curves after the shunting action of the system 100.

The controller 140 receives a signal, which is used for monitoring the characteristics of the system 100. The sensors 131, 132, 133, for example, can provide one or more signals to the controller 140 to permit monitoring of the state of a plasma in the plasma vessel 180. The controller 140 may include, for example, integrated circuits, such as micropro-cessors. Alternatively, a single integrated circuit or microprocessor can incorporate the controller 140 and other electronic components of the system 100. One or more microprocessors may implement software that executes the functions of the controller 140. Further, the controller 140 may be implemented in software, firmware, or hardware (e.g. as an application-specific integrated circuit.) The software may be designed to run on general-purpose equipment or specialized processors dedicated to the functionality herein described.

The controller 140 can open or close the switch unit 120 in response to one or more signals received from the sensors 131, 132, 133 to control plasma state transitions in the plasma vessel 180. For example, the controller 140 can support improved processing by detecting and terminating an undesirable state transition, and reigniting a desired plasma state. The controller 140 can also support improved ignition methods. In embodiments of the invention, controlled transitions between desired states include a period of no plasma in the vessel 180 as indicated by a signal received from one or more of the sensors 131, 132, 133.

A desired arc plasma, for example, is found in a tool coating PVD system that utilizes a cathodic arc clean/heat cycle. The system entails operation of a magnetron in a low-power arc plasma state. The magnetron provides an ion source for ion etching and implantation of the magnetron's target material on a tool being processed by the system. If the arc plasma extinguishes, the plasma may transition to a glow plasma state, leading to a loss of deposition rate and a ruined tool.

To avoid tool damage, in terms of the broad embodiment of FIG. 1a, the controller 140 can close the switch unit 120 to shut down the glow plasma, and then control further steps to reignite the desired arc plasma. In one embodiment of the invention, the controller 140 opens the switch unit 120 to permit energy stored in one or more inductors of the resonant circuit 110 to push ignition.

A desired glow plasma, for example, is found in a sputter PVD system, which can often exhibit undesirable transitions to an arc state. The various types of glow-to-arc transitions known to those having ordinary skill can receive a tailored response when detected by the controller 140.

In response to detection of a micro arc, the controller 140 can close the switch unit 120 to bring the current in the plasma vessel 180 to zero current, for example, in less than approximately 200 μsec in some embodiments, or, even less than approximately 1 μsec in some embodiments. Quickly reducing the current can reduce the likelihood of particulate formation and ejection.

Micro arc formation can be detected by the controller 140 via the signal or signals provided by the one or more sensors 131, 132, 133. The flux sensor 131, when coupled to a magnetic flux of an inductor of the resonant circuit 110, can permit the controller 140 to close the switch unit 120 within a length of time of arc onset that clips the arc current before excessive damage occurs. The formation of the arc will generally cause a rapid decrease in voltage and an increase in current.

The controller 140 can close the switch unit 120 for a fraction of a cycle of the resonant circuit to extinguish the micro arc. The current can then decline through zero.

The switch unit 120 can be kept closed, for example, for a high current half cycle of the resonant circuit 110. The controller 140 can then open the switch unit 120, and the resonant circuit 110 can ring positive and support a voltage overshoot to reignite the glow plasma.

A hard, or persistent arc, can be both more difficult to extinguish and more difficult to confirm as extinguished than a micro arc. The controller 140 can perform repeated cycling of the switch unit 120 until the hard arc is extinguished. In the case of a hard arc, it can be advantageous to utilize both the flux sensor 131 and one or both of the voltage and current sensors 132, 133 to confirm extinguishment. Thus, the likelihood of a false indication of arc formation or extinguishment can be reduced.

To simplify signal sensing and control features of the invention, the sensors 132, 133 can provide a limited set of discreet values to the controller 140. The controller 140 can then respond in a closed-loop manner. Control functions that may be implemented by the controller 140 are further described below with reference to FIGS. 200 and 300.

In a more detailed embodiment of the system 100, the controller 140 incorporates system condition sensing and adaptive response features. For example, the controller 140 can receive additional signals that indicate additional process and status conditions of the system 100. In response to the system 100 status and process conditions, the controller 140 can invoke a pattern, for example, a process recipe, that better suits present conditions. Thus, the controller 140 can select an appropriate pattern or behavior. A change in pattern can be associated with, for example, a change in the number and/or type of steps included in a process rather than a simple change in the length of one or more existing steps.

The plasma vessel 180 may be, for example, a DC cathode-based sputter vessel. Such a vessel 180 may include a magnetron device for focusing and concentrating a plasma in the vessel 180. The vessel 180 may be a conventional plasma processing chamber. For example, a reactive gas can be introduced between a target and a substrate in the vessel to support reactive sputter deposition. The substrate can be biased with a DC or RF source in order to enhance the deposition process. The substrate backplane can include a heating mechanism utilizing backside gas to heat the substrate. The backplane may rotate for a more uniform sputter deposition on the substrate.

Figure 2:
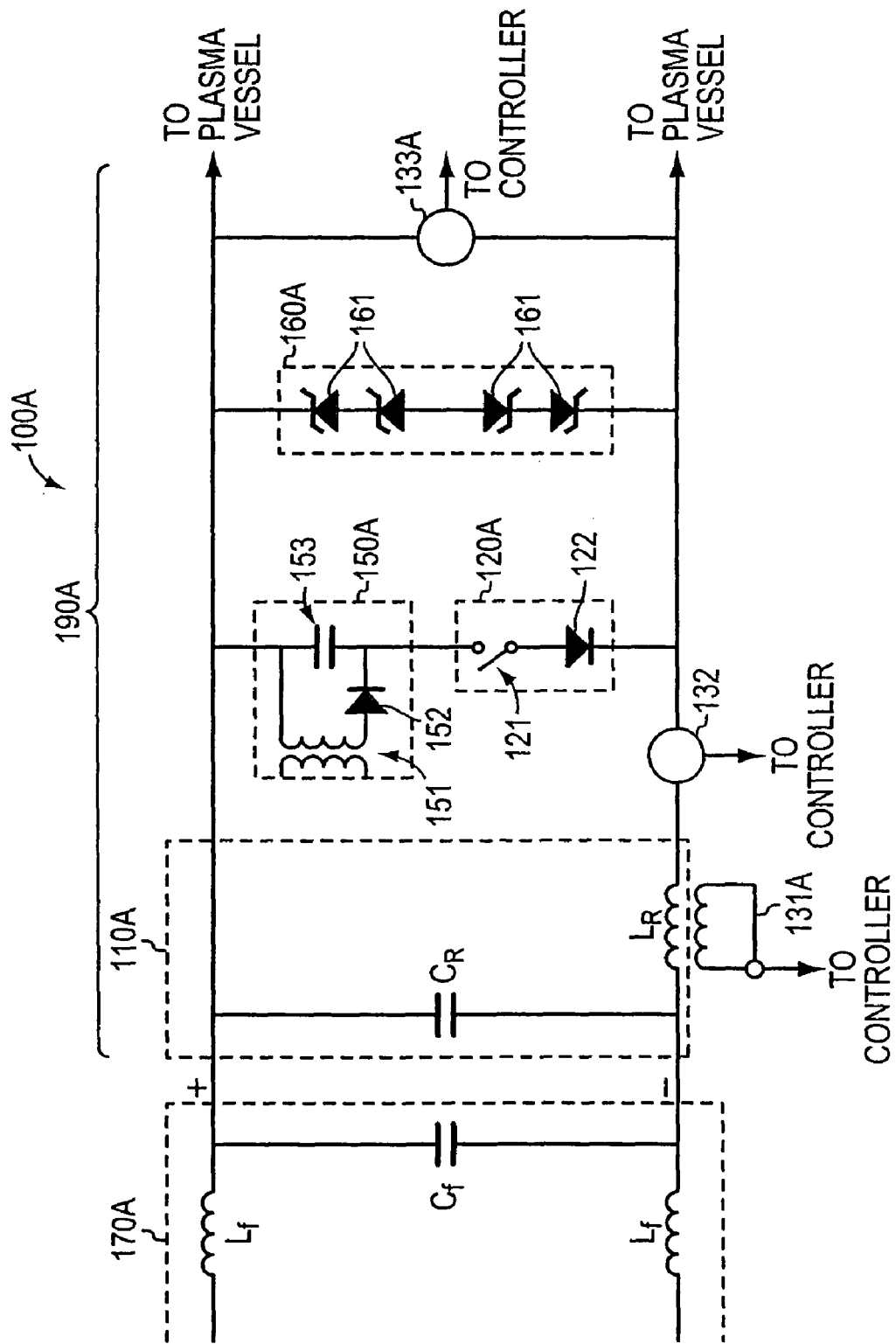
FIG. 2 is a block diagram of an embodiment of a plasma processing system.

FIG. 2 is a block diagram of a plasma processing system 100A that includes an apparatus 190A that is an exemplary embodiment of the apparatus 190 shown in FIG. 1a. The system 100A includes a resonant circuit 110A, a switch unit 120A, a flux sensor 131A, a current sensor 132A, a voltage sensor 133A, a voltage clamp circuit 160A, and a power supply 170A. The system 100A optionally includes a zero-bias supply unit 150A, The power supply 170A is a DC supply, and includes filter inductors $L_f$ in series with the output of the supply 170A, and a filter capacitor $C_f$ in parallel with the output of the supply 170A. The switch unit 120A includes a switch 121 and, in some embodiments, a diode 122. The switch 121 can be, for example, a gas switch, a SCR switch, an IGBT switch, an SiT switch, a FET switch, a GTO switch, or a MCT switch. More generally, a switch unit 120A can include two or more switches of common or different types. The diode 122 can be, for example, a zener diode.

The diode 122 causes the switch unit 120A to act as a one-way switch. When the switch 121 is closed, the diode 122 permits development of a reverse polarity current flow to the cathode of a plasma vessel. A reverse current can accelerate the transition to a no plasma state in the plasma vessel as indicated by one or more signals from the sensors 131A, 132A, 133A. When closed in response to an arc plasma forming in a vessel, the switch unit 120A in some embodiments may carry, for example, a peak current of approximately 85 A while the cathode experiences a peak current of approximately 20 A (relative to a run current of approximately 14 A.)

The zero-bias supply unit 150A includes a transformer 151, a diode 152 and a capacitor 153. The transformer 151 is in electrical communication with a controller, for example, the controller 140 illustrated in FIG. 1a A voltage provided by the supply unit 150A modifies a voltage drop caused by the resistance of the switch unit 120A and other components, if any, in series with the switch unit 120A. The supply unit 150A can be used to reduce a required number of switches 121 in a switch unit 120A, for example, by applying an offset voltage equal to the voltage drop across the one or more switches 121 at the peak current.

For example, if the switch 121 is implemented as two FETs, each representing a resistance of 1Ω, the two FETs, in series, will present a resistance of 2Ω. For a 50 A current, the voltage drop will be 100 V. In this case, the supply unit 150 offset can be set to 100 V. The load current, i.e., the plasma vessel 180 current, can have a secondary effect on a desired level of zero-bias supply unit 150 offset.

Competing goals must be balanced to identify an appropriate resistance for the switch unit 120A. To create an effective alternative electrical path, the switch unit 120A can have a similar or lower resistance with respect to an arc plasma. To dissipate energy to avoid inadvertent reignition of the arc plasma, the switch unit 120A should have a significant resistance. In a typical embodiment, the balance of impedance is set to have the switch unit 120A impedance approximately equal to the typical arc plasma impedance.

For example if the arc plasma develops a voltage drop of 40 V at approximately 60 amps, this corresponds to an impedance of 0.67 ohms. A typical switch impedance for these conditions would be approximately 0.6 ohms or less. When the zero-bias supply unit 151A is not used, an impedance of the switch unit 121 can be similar to that of the plasma, at least at the beginning of a shunt period.

The voltage clamp circuit 160A includes diodes 161 in series and in two groups oriented respectively for forward and reverse voltage clamping. The diodes can be, for example, unidirectional zener diodes. Some optional structures and methods of operation of a voltage clamp circuit 160 are described in U.S. Pat. No. 6,524,455 to Sellers.

The resonant circuit 110A includes an inductor $L_R$ in series with the output of the power supply 170A and the input of the plasma vessel, and a capacitor $C_R$ in parallel with the output of the power supply 170A and the input of the plasma vessel. The capacitor Cr and the inductor Lr can be chosen to be as fast as possible. A high frequency limitation can arise from a need to have the inductor Lr be the dominant inductance (largest value) between the output of the power supply 170A and the input of the plasma vessel 180. It can also be beneficial to maintain enough energy in the resonant circuit 110A to ring the current through zero. This energy can be in proportion to a DC process current in the plasma vessel 180.

The low end of the frequency range can be determined by the power supply's sensitivity. It can be desirable for the power supply 170A to ignore the operation of the resonant circuit 110A, and only shut down when commanded by the controller 140 in order, for example, to maintain a deposition rate that is as constant as possible. Thus, the value of the power supply 170A filter inductor $L_f$ can be selected to be much larger than inductor Lr, for example, 10× or more larger. For example, inductor Lr can have a value of 10 µH while power supply 170A filter inductor $L_f$ can have a value of 2 mH.

The flux sensor 131A of FIG. 2 includes an inductor disposed adjacent to the inductor $L_R$ of the resonant circuit 110A so that a current is induced in the flux sensor 131A when a changing current passes through the inductor $L_R$ of the resonant circuit 11A. The inductor $L_R$ of the resonant circuit 110A can include, for example, a coil, such as an in an air core inductor; the flux sensor 131A can include a coil that is disposed co-axially within the inductor $L_R$ of the resonant circuit 110A. The flux sensor is sensitive to changes in current in the resonant circuit 131A, as arise, for example, when a transition occurs in a state of a plasma within the plasma vessel and/or when the switch unit 160A is closed.

A coil-based flux sensor 131A can include a coil made from fine gauge wire to simplify manufacturing. The flux sensor 131A can include a high speed SCR or thyratron coupled to a coil. Preferably, the flux sensor 131A is the last component in the current path to a plasma vessel, for example, co-Located with the inductor $L_R$ as the final components leading to a connector that is connected to the plasma vessel.

The current sensor 132A voltage sensor 133A can sense, respectively, current and voltage of at least one of the resonant circuit, the power supply, and the input of the plasma vessel. One or a combination of the sensors 131A, 132A, 133A can be utilized to support the functionality of a controller. Sensor readings are sampled in some embodiments at fractional or integer multiples of the resonant frequency of the resonant circuit 110.

Figure 3:
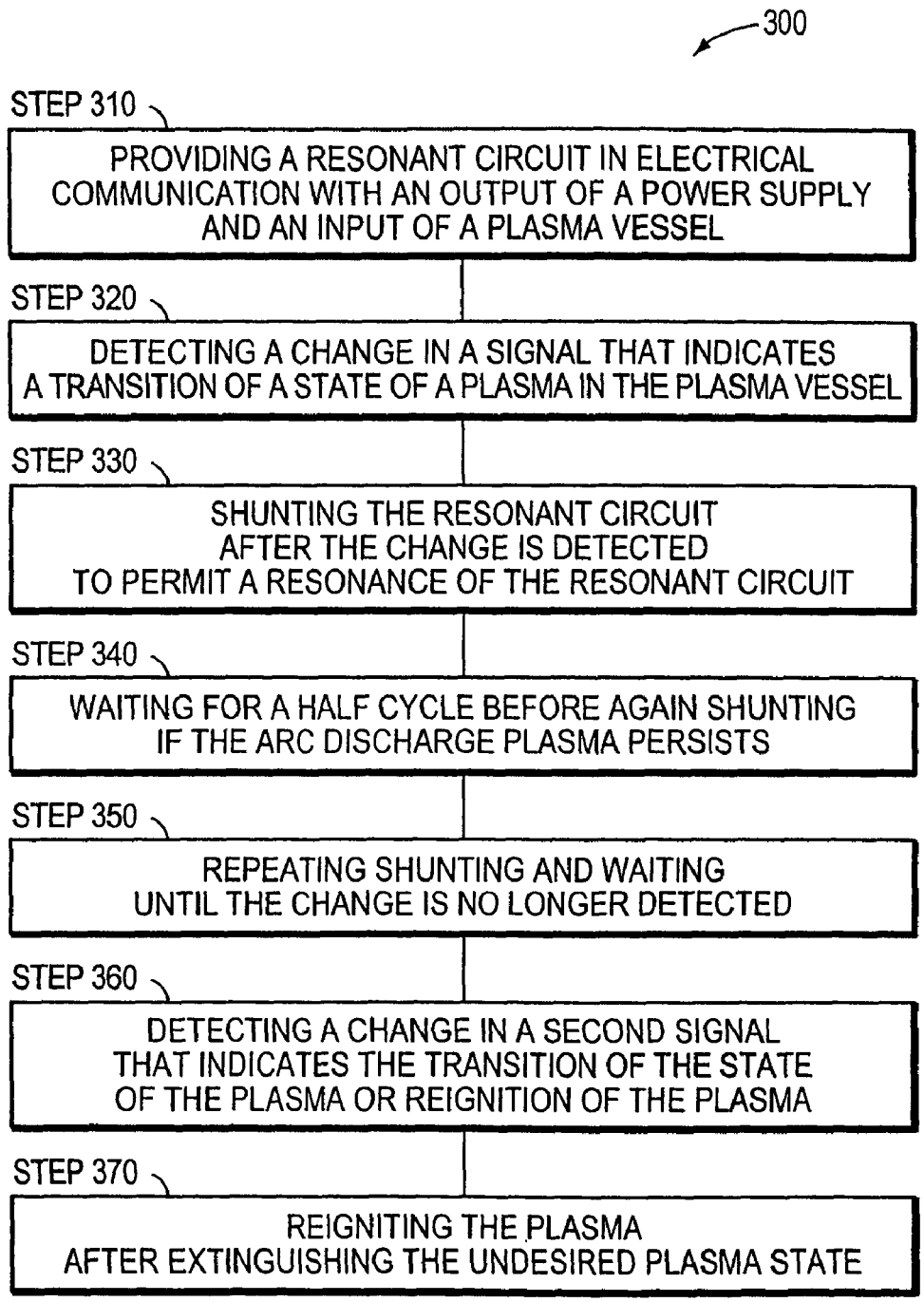
FIG. 3 is a flowchart of an embodiment a method for controlling a plasma used for materials processing.

FIG. 3 is a flowchart of an embodiment of method 300 for controlling a plasma used for materials processing. The method 300 can be implemented, for example, with the apparatus 190, 190A illustrated in FIGS. 1a and 2. The method includes providing a resonant circuit in electrical communication with an output of a power supply and an input of a plasma vessel (Step 310). The resonant circuit can store and release energy. The method also includes detecting a change, for example, in a signal, that indicates a transition of a state of a plasma in the plasma vessel (Step 320), and shunting the resonant circuit after the change is detected to permit a resonance of the resonant circuit (Step 330).

In some embodiments, the shunting continues for a period equal to a half cycle of the resonant circuit. The method 300 in some such embodiments includes waiting for a half cycle before again shunting, if the arc discharge plasma persists (Step 340). The process of shunting and waiting is repeated in some embodiments until the change is no Longer detected (Step 350). The process of shunting and waiting may terminate when a change that indicates the transition of the state of the plasma or the extinguishment of the plasma is detected (Step 360). The method may also include reigniting the plasma after extinguishing the undesired plasma state (Step 370).

The possible states of the plasma in the plasma vessel include, for example, various glow plasma states, various arc discharge states, and a no plasma state indicated by one or more signals that can be acquired, for example, by the sensors 131, 132, 133 illustrated in FIG. 1a. Any of a variety of changes in the signal can be utilized to detect the onset of a state transition. The flux sensor 131 may be the most effective at detecting the onset of a change of plasma state. Features of the flux sensor 131 are described below with reference to FIG. 8.

Figure 4:
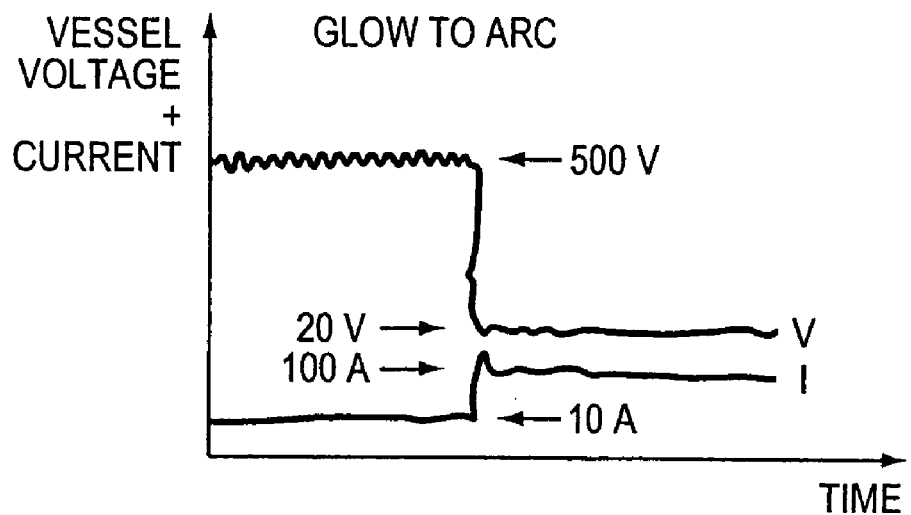
FIG. 4 is a graph of voltage and current change over time during the transition from a glow plasma to an arc plasma.
Figure 5:
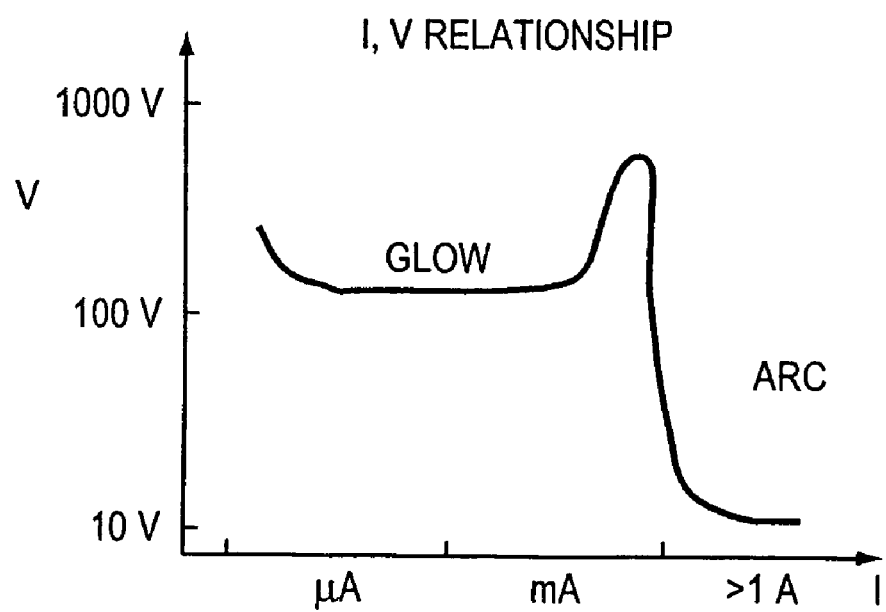
FIG. 5 is a graph of voltage and current in a glow plasma, and voltage and current in an arc plasma.

Referring to FIGS. 4 and 5, the state of the plasma in the vessel may be determined, for example, via examination of the current and/or voltage levels associated with a plasma. FIG. 4 is a graph that qualitatively illustrates how voltage and current change over time during the transition from a glow plasma to an arc plasma. FIG. 5 is a graph that qualitatively illustrates the relationship between voltage and current in a glow plasma and an arc plasma. The glow and arc plasmas may be identified by their characteristic values. For example in FIG. 4, a glow plasma is characterized by a voltage of approximately 500 V and a current of approximately 10 A whereas an arc plasma is characterized by a current of approximately 100 A and a voltage of approximately 20 V. Thus, sensing of voltage and/or current levels and their transition is one means to obtain an indication of plasma state and state transition.

When current and voltage levels are changing, the phase relationship between current and voltage signals can be used to indicate a plasma state in a vessel. For example, shunting (Step 330) can entail extinguishing the plasma in the plasma vessel, and the signal can be used to confirm that the plasma has been extinguished. For example, in the off state, the plasma vessel exhibits a capacitive impedance, while in the glow or arc discharge plasma states, the vessel exhibits an inductive impedance. Examination of the relationship of voltage and current waveforms, as provided by one or more sensors, permits determination of the present impedance of the vessel. For example, both a glow plasma and an arc discharge plasma exhibit a voltage leading current characteristic. This characteristic can be observed, for example, when the glow or arc plasmas are newly formed and have yet to stabilize.

Figure 6:
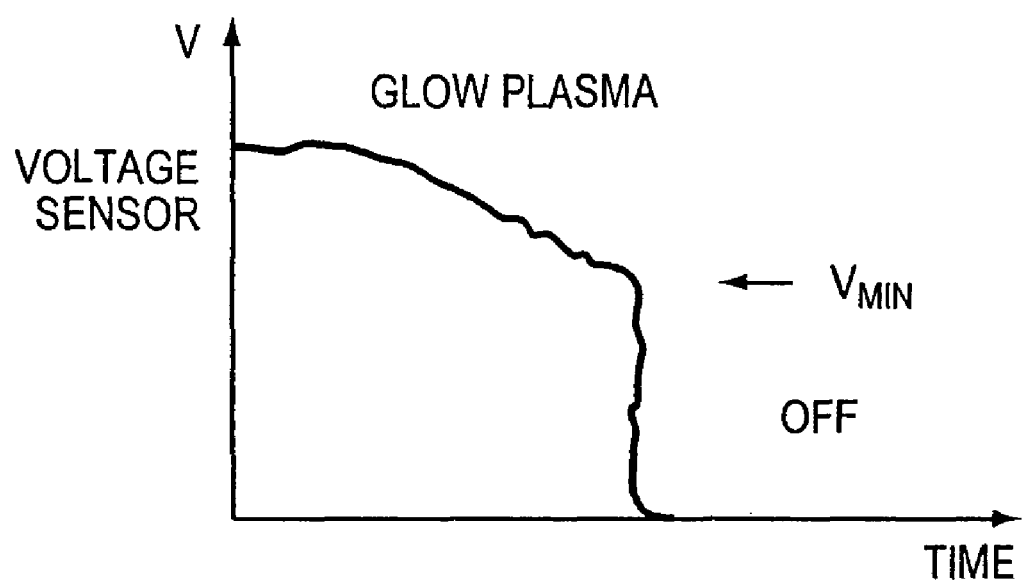
FIG. 6 is a graph that illustrates the measured change in voltage over time of a glow plasma state in a sample system.

Referring to FIG. 6, a voltage level alone can be used, for example, to conclude that a plasma has been extinguished. For example, a minimum voltage that can sustain a glow plasma may be experimentally determined for a particular embodiment of the system 100 being operated under particular process conditions (e.g., gas type and pressure conditions.) FIG. 6 is a graph that illustrates the measured change in voltage (sensed, for example, by a voltage sensor) over time of a glow plasma state in a sample system. The data for the graph was obtained by decreasing the power applied to a plasma vessel containing a glow plasma, and sensing the voltage across the plasma vessel.

For example, at 9 watts delivered power, the voltage is 233 V. At 8 watts delivered power, voltage ripple increases while the overall voltage declines. As the delivered power decreases to approximately 6 watts, the plasma collapses, i.e., extinguishes, The power level at which the plasma collapses corresponds to a voltage level $V_{min}$. as indicated on the graph. Thus, the experimentally determined voltage level $V_{min}$ can then serve as a threshold voltage when sensing plasma vessel voltage to confirm that a glow plasma has been extinguished.

When the resonant circuit is shunted (Step 330), the current flowing through the plasma vessel can be substantially reduced during an initial half cycle of the resonant circuit relative to a current flowing through the vessel prior to the initial half cycle. For example, closing of the switch unit 120 can reduce the current in the plasma vessel 180 at a rapid rate during a first half cycle of the resonant circuit 110. The half cycle of the resonant circuit may have a range of approximately 1 to 50 μsec. After shunting for a half cycle, the shunt can be removed. Brief shunting can be sufficient to extinguish a plasma in the vessel.

Figure 7:
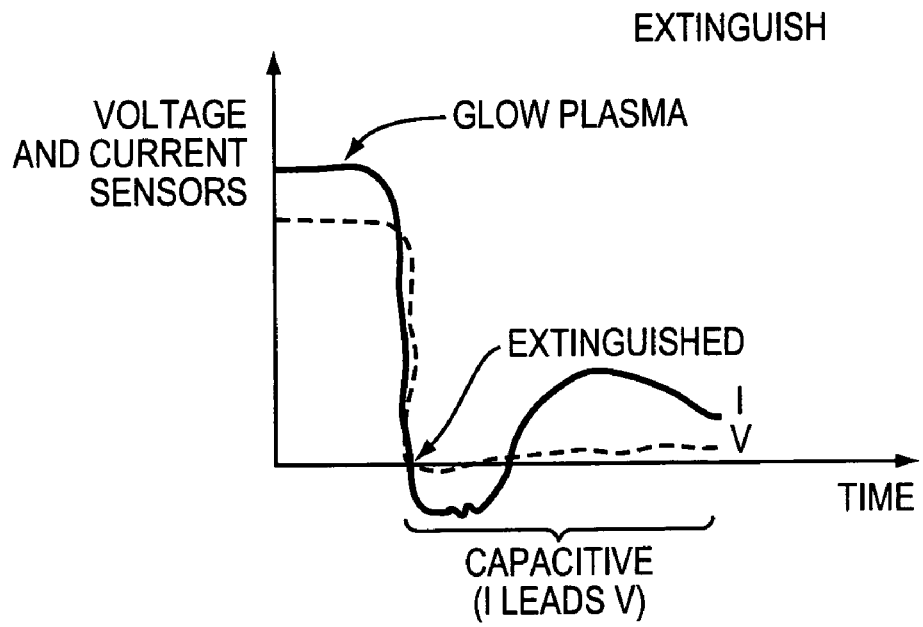
FIG. 7 illustrates current and voltage curves that can be collected by sensors.

FIG. 7. illustrates current and voltage curves, as can be collected with the sensors 132, 133. The curves illustrate a glow plasma transitioning to an extinguished state. When the resonant circuit 110 is shunted, the current and voltage rapidly decline. The current and voltage, however, may not settle to zero. For example, the current can be approximately 0.5 A and the voltage approximately 10 V.

Further, a unipolar switch can be employed, which can allow the resonant circuit 110 to ring below zero during the second half of a cycle. A unipolar switch can also make the timing of the off transition of the switch less critical. The plasma in the vessel 180 may be considered extinguished when current switches its direction of flow.

The method 300 of the present invention can include waiting for a half cycle, or other interval, before again shunting, if, for example, an arc discharge plasma persists (Step 340). Further, the shunting (Step 330) and waiting (Step 340) steps can be repeated until the change (Step 320) is no longer detected (Step 350). Failure to extinguish the arc after a preselected number of repeat cycles, or after a preselected period of time has elapsed, can lead to shutdown of a power supply. In this case, shunting can be allowed to continue until the supply is caused to shutdown, for example, for more than a half cycle.

Sensing a change in a second signal can support identification of the transition of a plasma state, and confirmation of reignition of the plasma (Step 360). Reigniting the plasma (Step 360) after extinguishing the undesired plasma state can entail, for example, reigniting a glow or arc plasma. To obtain an arc plasma, the resonant circuit can be shunted to increase an energy stored in the resonant circuit, and then removing the shunt to direct the stored energy to the input of the plasma vessel to ignite the plasma in the plasma vessel. The stored energy can be allowed to increase the power supply current to a level greater than a steady-state current of an arc discharge plasma. The shunt can then be removed to direct the current to the input of the plasma vessel. An arc discharge plasma may thereby be ignited in the plasma vessel, without contacting a cathode of the vessel, in contrast to common prior practice.

To obtain a glow plasma, the resonant circuit can be shunted to increase the stored energy in the resonant circuit for an effective portion of a cycle of the resonant circuit. The shunt can then be removed to direct the stored energy to the input of the plasma vessel thereby igniting a glow discharge plasma in the plasma vessel. An effective portion of a cycle can be ½ of a cycle.

Figure 8:
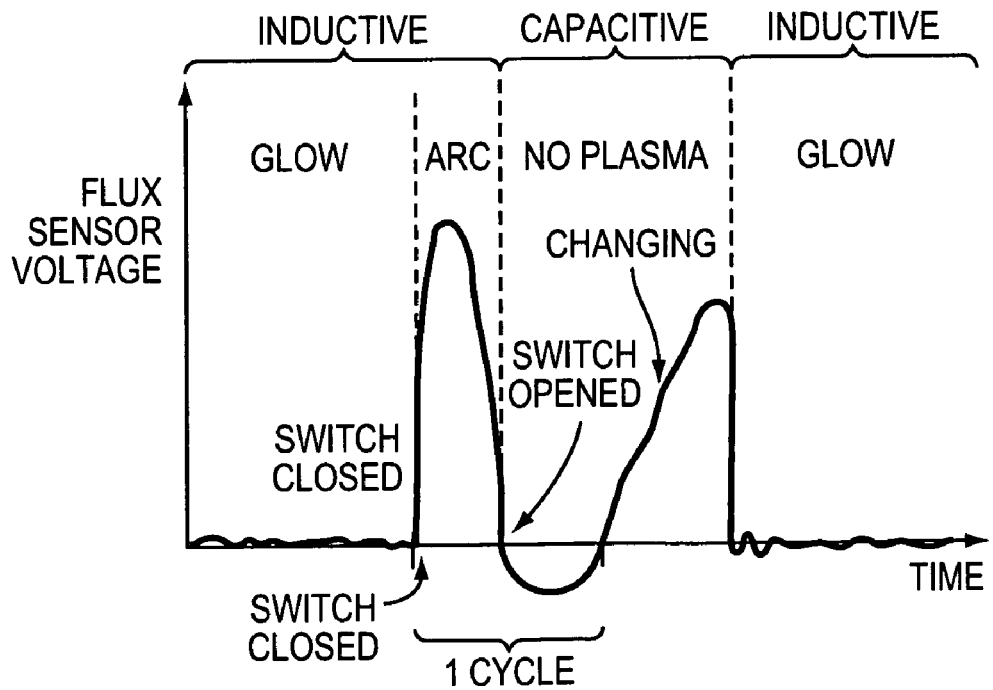
FIG. 8 is a graph of a flux sensor voltage over time.
Figure 9:
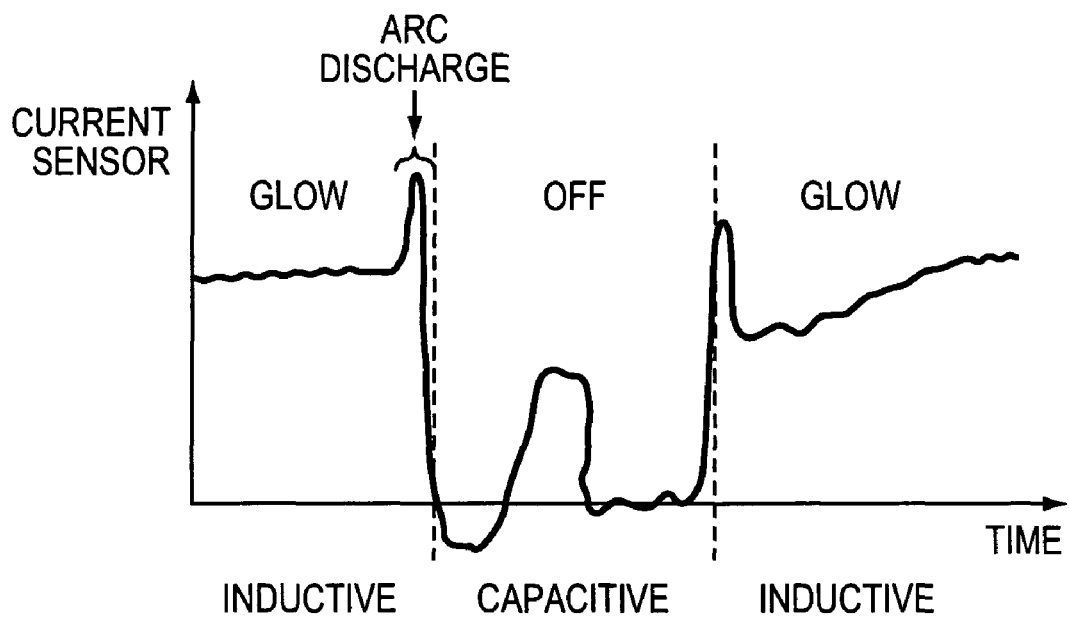
FIG. 9 is a graph of a current sensor current over time.

Referring to FIGS. 8 and 9, an example of an undesired transition of a glow plasma to an arc plasma, extinguishment of the arc plasma by shunting, and reignition of the glow plasma are described. FIG. 8 is a graph of the flux sensor 131 voltage versus time; FIG. 9 is a graph of the current sensor 132 current versus time. The flux sensor 131 signal is a sensitive and rapid indicator of the onset of an arc plasma. When the arc is detected, the resonant circuit is shunted for a half cycle, causing a rapid decline in current in the current sensor to zero (no plasma), with a small swing to a negative current as the circuit oscillates. A rise in the voltage level of the flux sensor 131, can be used as an indicator that a transition, for example, to an arc plasma, has occurred.

Since the flux sensor 131 provides an accurate indicator of plasma transition, a small voltage level can be chosen as a threshold indicator of plasma onset. For example, a voltage of 1.0 V can be chosen as the threshold level. Shunting of the resonant circuit can being in response to detection of the flux sensor voltage rising above the threshold level.

For example, for a resonant circuit having an inductor of value 12 μh and a capacitor of value 0.1 μf, the resonant frequency will be 145 khz. These example values can cover, for example, a large range of sputtering conditions from a few watts to as high as 60 kw.

These example values are also effective over a wide range of gase types, gas flow rates and target materials. Some of the more exotic target materials, however, may need some small adjustments in a controller to be optimally effective, as the voltage and current ranges for an arc discharge can be as high as some sputter processes.

An example of this effect is found in the sputter deposition of TiB2 (titanium diboride). In a process the TiB2 had a sputter voltage of 385 V DC, and the voltage dropped to 310 V DC upon arcing. The discharge, however, was very visible arc, thus sensors, for example, sensors 131, 132, 133, should identify this small change as a transition. Thus, more than one sensor can be required to adequately define the plasma mode, and a controller may be more effective with sufficient capacity to define small state changes.

The shunt can be removed approximately at or after the time the plasma is extinguished. Removing the shunt can also initiate the process of reigniting the glow plasma. The flux sensor 131 reveals the capacitive charging phase, as does the current sensor 132. After ignition and settling to a stable condition, the flux sensor 131 shows no signal while the current sensor 132 shows a stable current indicative of the glow plasma.

Reignition can be more reliably detected with two sensors. For example, a combination of any of the following sensors may be used to detect ignition: the flux sensor 131, the voltage sensor 133, the current sensor 132, and a light sensor (not shown) disposed to detect light emitted by the plasma in the vessel. The signal from the second sensor can be used to validate indication of plasma reignition provided by the signal from the first sensor. A sensor signal may also be used to indicate the type of plasma in the vessel. For example, the character of the light emitted by the plasma indicates the type of plasma in the vessel. The light intensity of an arc plasma can be approximately 10 times greater than that of a glow plasma.

To observe light emitted by the plasma, a light sensor may be a broadband sensor, for example, a silicon detector. The controller 140, for example, gate the signal from the light sensor to an arc extinguishing cycle. That is, a light signal can be collected while current in the plasma is driven to zero to obtain an indication of the absence of the plasma when substantially all of the light emission vanishes. The plasma in the vessel may be considered extinguished when no substantial light emission is detected.

Figure 10:
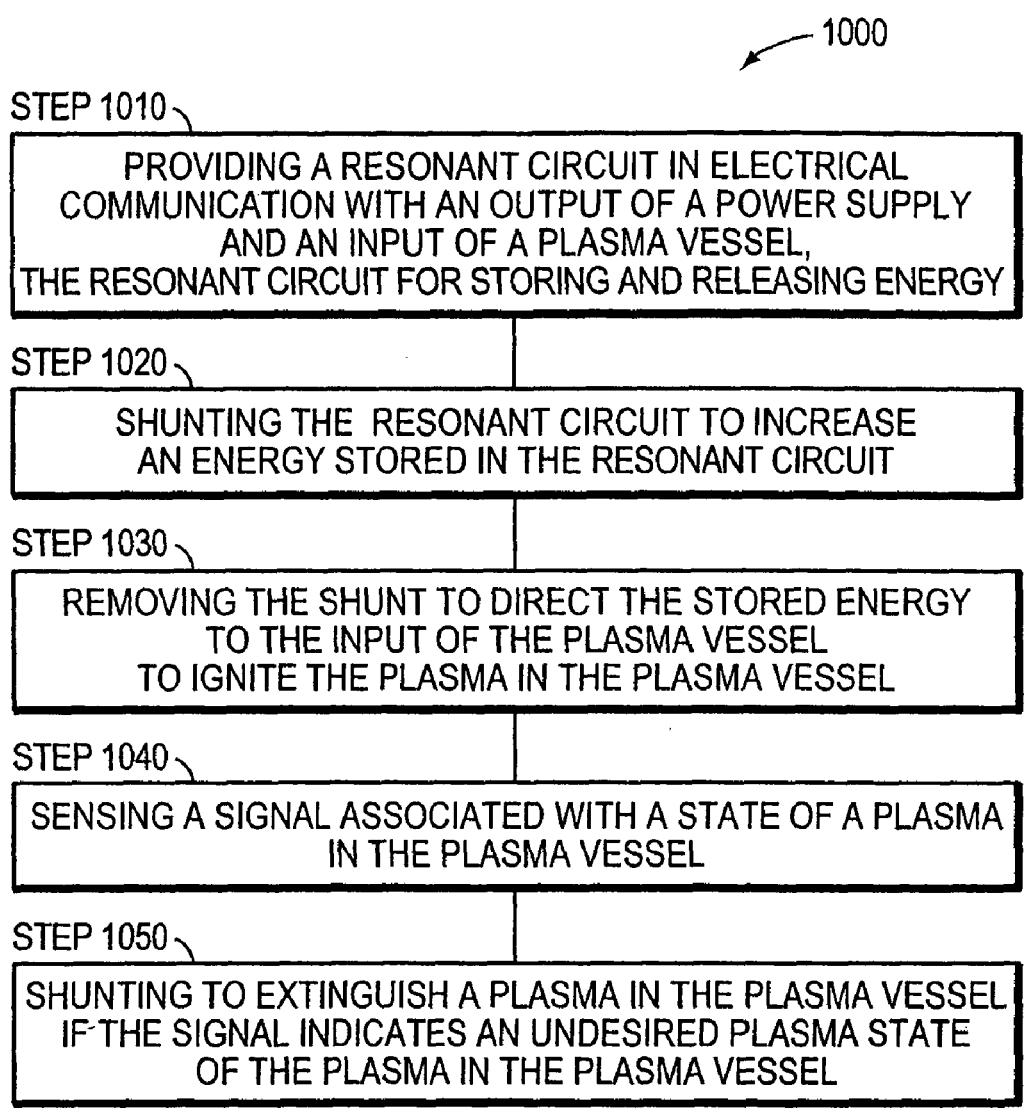
FIG. 10 is a flowchart of a method for igniting a plasma used for materials processing.

Referring to FIG. 10, some features of the invention provide improved plasma ignition methods. FIG. 10 is a flow-chart of a method 1000 for igniting a plasma used for materials processing. The method 1000 can be implemented with the systems 100, 100A illustrated in FIGS. 1a and 2, and can be utilized in combination with the method 300. The method 1000 includes providing a resonant circuit in electrical communication with an output of a power supply and an input of a plasma vessel, the resonant circuit for storing and releasing energy (Step 1010), shunting the resonant circuit to increase an energy stored in the resonant circuit (Step 1020), and removing the shunt to direct the stored energy to the input of the plasma vessel to ignite the plasma in the plasma vessel (Step 1030). It will be apparent to one having ordinary skill in the plasma processing arts that proper related conditions should be provided to ignite a plasma, for example, gas type, pressure, and flow rate conditions.

The method 1000 optionally includes sensing a signal associated with a state of a plasma in the plasma vessel (Step 1040), for example, to confirm ignition of the plasma. Ignition can be confirmed, for example, as described above with respect to the method 300. Also, as described above with respect to the method 300, if the is signal indicates an undesired plasma state of the plasma in the plasma vessel, shunting can be applied to extinguish the plasma (Step 1050).

To ignite an arc plasma, the resonant circuit can be shunted until the resonant circuit causes a current of the power supply to be greater than a steady-state current of an arc plasma. The shunt can then be removed to direct the current to the input of the plasma vessel to ignite the arc plasma in the plasma vessel. In general, a system must deliver more energy to a gas to force the gas to an arc discharge condition than required to obtain a glow discharge condition.

The controller 140 can close the switch unit 120 to create a short across both the plasma vessel 180 and the power supply 170. The short permits the power supply 170 to ramp the output current up to an appropriate level somewhat above the desired stable operating current level for an arc plasma. When the controller 140 detects an indication that the DC current has attained the elevated level, the controller 140 opens the switch unit 120. The current then shifts from the switch unit 120 to the cathode of the plasma vessel 180, causing both a high voltage and high current that forces an arc plasma to form to support the current. An arc discharge can thus be ignited without use of a physical contact step to deliver the ignition energy to the cathode.

To ignite a glow plasma, the resonant circuit can be shunted for an effective portion of a cycle of the resonant circuit to increase an energy stored in the resonant circuit. The shunt can then be removed to direct the stored energy to the plasma vessel after the effective portion of the cycle to ignite the glow plasma in the plasma vessel. The effective portion of the cycle can be a half cycle.

For example, the controller 140 can wait until a DC output voltage of the supply 170 settles at its peak value. The controller 140 can then close the switch unit 120 for a half cycle to increase energy stored in an inductor of the resonant circuit 110 as the circuit rings out and goes positive. The voltage level can increase until limited by the clamp circuit 160 or until the glow plasma ignites.

Figure 11:
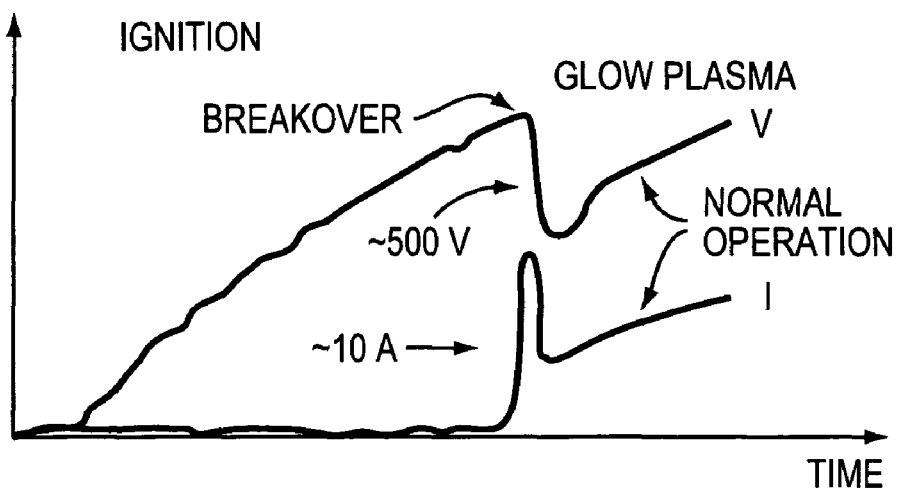
FIG. 11 is a graph of voltage and current curves over time for a plasma processing system.

Referring to FIG. 11, ignition of a glow plasma, for example, can be determined by observation of voltage or current levels provided by voltage or current sensors. FIG. 11 is a graph of voltage and current curves versus time. The increasing voltage eventually drops after reaching an ignition voltage level, when a capacitive discharge marking the beginning of ignition occurs. The brief high voltage and low current behavior corresponds to a Townsend discharge ignition phase. The voltage then drops, and eventually settles at an operational level. In the normal operation region indicated in the graph, an increase in voltage provides an approximately linear increase in current of the glow plasma.

The gradual rise in voltage prior to plasma formation corresponds to charging of the capacitance associated with the plasma vessel. The current does not rise with voltage prior to breakdown because no plasma exists in the vessel to provide conduction through the vessel. The rapid increase in current indicates initiation of a plasma, and the current then settles to an operational level.

The observed overvoltage required for ignition can support confirmation that a plasma has been ignited, and thus also can confirm that a plasma had first been extinguished. The level of overvoltage required to ignite a plasma can be affected by the condition of a plasma vessel. For example, a vessel that has held a plasma within the previous hour can exhibit a smaller overshoot upon reignition than would a completely "cold" vessel. While a cold ignition voltage can be, for an exemplary vessel, approximately 1250 V, a hot ignition voltage for the same vessel can be approximately 750 V, with stable operation settling at approximately 500 V. The overshoot level will tend to decrease with shorter off periods between reignition until reaching a nearly constant overshoot voltage for a particular set of conditions. A plasma may be extinguished within, for example, the prior 1 μsec to 10 seconds. While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for DC-plasma processing comprising:
   supplying power to a plasma vessel with a power supply, to ignite a plasma in the plasma vessel;
   measuring current across a resonant circuit that is in electrical communication with an output of the power supply;
   measuring voltage across the resonant circuit;
   detecting that a plasma arc is imminent prior to arc initiation by determining that a linear voltage drop has occurred over a time duration for which current is substantially constant based on the measured current and measured voltage; and
   controlling a switch in parallel with the output of the power supply to shunt current away from the plasma prior to arc initiation to increase energy stored in the resonant circuit to extinguish the plasma in response to conditions leading to an arc, and controlling the switch to direct the energy stored in the resonant circuit to the input of the power supply when the conditions leading to an arc are stopped, wherein energy stored in the resonant circuit from shunting current away from the plasma can reignite the plasma after the plasma is extinguished.

2. The method of claim 1, wherein the resonant circuit comprises an inductor.

3. The method of claim 1, wherein signals from the power supply redirect to the switch when energy stored from shunting current away from the plasma is high and the plasma is extinguished, to control the switch to boost current.

4. The method of claim 3, wherein the controller controls the switch when the conditions leading to the arc are stopped, the current is low, and the plasma is extinguished to allow the power supply to continue normal ignition of the plasma.

5. The method of claim 4, wherein the controller controls the switch to allow the power supply to continue normal operation when the conditions leading to the arc are stopped and the plasma is reignited.

* * * * *